(12) United States Patent
Estinto et al.

(10) Patent No.: US 8,927,069 B1
(45) Date of Patent: Jan. 6, 2015

(54) METHOD AND APPARATUS FOR IMPROVING RADIO FREQUENCY SIGNAL TRANSMISSION THROUGH LOW-EMISSIVITY COATED GLASS

(71) Applicant: Eritek, Inc., Leesburg, VA (US)

(72) Inventors: Eugenio Estinto, Leesburg, VA (US); Robert Winsor, Round Hill, VA (US)

(73) Assignee: Eritek, Inc., Leesburg, VA (US)

( * ) Notice: Subject to any disclaimer, the term of this patent is extended or adjusted under 35 U.S.C. 154(b) by 0 days.

(21) Appl. No.: 14/044,031

(22) Filed: Oct. 2, 2013

(51) Int. Cl.
*B05D 5/12* (2006.01)
*B05D 3/06* (2006.01)
*B05D 3/10* (2006.01)
*B05D 3/12* (2006.01)
*B05D 3/14* (2006.01)
*C03C 15/00* (2006.01)
*C03C 19/00* (2006.01)
*C03C 17/06* (2006.01)
*B23K 26/36* (2014.01)
*G02B 1/11* (2006.01)
*C23C 14/58* (2006.01)
*B32B 17/06* (2006.01)
*G02B 1/12* (2006.01)
*G02B 1/10* (2006.01)
*C23F 1/02* (2006.01)

(52) U.S. Cl.
CPC .............. *C03C 17/06* (2013.01); *B23K 26/365* (2013.01); *G02B 1/118* (2013.01); *C23C 14/58* (2013.01); *G02B 1/116* (2013.01); *B32B 17/061* (2013.01); *G02B 1/12* (2013.01); *C23C 14/5813* (2013.01); *G02B 1/10* (2013.01); *C23F 1/02* (2013.01)
USPC .......... 427/555; 427/163.1; 427/165; 216/13; 216/24; 216/53; 216/108; 219/69.1; 219/69.17; 219/121.69

(58) Field of Classification Search
CPC ............... B60R 1/00–1/12; B60R 2001/1284; B60R 2011/0026; B32B 17/061; B32B 17/10165; B32B 17/10174–17/1022; B32B 17/10247; B32B 17/105; B32B 17/10293; B32B 17/10376–17/10422; G02B 1/10; G02B 1/105; G02B 1/11; G02B 1/12; B60J 3/00; B60J 3/007; B60J 3/02; B60J 3/04; B60J 3/06; C23C 14/048; C23C 14/5813; C23C 16/047; C23C 16/56
USPC ........... 216/13, 24, 28, 31, 41, 49, 52, 53, 65, 216/67, 75, 76, 78, 83, 87, 100, 108, 109; 219/68–70, 121.67–121.72; 451/28, 451/29; 427/554–556, 162–169
See application file for complete search history.

(56) References Cited

U.S. PATENT DOCUMENTS 2,279,567 A * 4/1942 Holman .................. 205/120
4,353,952 A * 10/1982 Brown et al. ............ 428/201

(Continued)

FOREIGN PATENT DOCUMENTS

JP 60-66203 A * 4/1985 ............... 427/163.1

OTHER PUBLICATIONS

S. Peter Pappas, PhD, editor; UV Curing: Science and Technology; technology marketing Corporation, Connecticut, USA; 1978 (no month), excerpt p. 96-129.*

(Continued)

Primary Examiner — Marianne L Padgett
(74) Attorney, Agent, or Firm — Edward W. Yee

(57) ABSTRACT

A method and apparatus for modifying low emissivity (low-E) coated glass, so that windows using the processed glass allow uninterrupted use of RF devices within commercial or residential buildings. Glass processed in the manner described herein will not significantly diminish the energy conserving properties of the low-E coated glass. This method and apparatus disrupts the conductivity of the coating in small regions. In an embodiment, the method and apparatus ablates the low-E coating along narrow contiguous paths, such that electrical conductivity can no longer occur across the paths. The paths may take the form of intersecting curves and/or lines, so that the remaining coating consists of electrically isolated areas. The method and apparatus are applicable both to treating glass panels at the factory as well as treating windows in-situ after installation.

12 Claims, 5 Drawing Sheets

(56) References Cited

U.S. PATENT DOCUMENTS

| | | | | |
|---|---|---|---|---|
| 5,168,793 | A * | 12/1992 | Padamsee | 99/279 |
| 7,241,506 | B2 * | 7/2007 | Hartig | 428/432 |
| 7,518,093 | B2 * | 4/2009 | Veerasamy et al. | 219/772 |
| 2003/0092267 | A1 * | 5/2003 | Kian et al. | 438/690 |
| 2003/0227663 | A1 * | 12/2003 | Agrawal et al. | 359/265 |
| 2005/0195488 | A1 * | 9/2005 | McCabe et al. | 359/603 |
| 2005/0270248 | A1 * | 12/2005 | Wilhelm et al. | 343/788 |
| 2005/0270621 | A1 * | 12/2005 | Bauer et al. | 359/265 |
| 2009/0114928 | A1 * | 5/2009 | Messere et al. | 257/88 |
| 2009/0130607 | A1 * | 5/2009 | Slafer | 430/323 |
| 2009/0134793 | A1 * | 5/2009 | Cseh et al. | 313/580 |
| 2010/0200539 | A1 * | 8/2010 | Yun et al. | 216/13 |
| 2010/0215903 | A1 * | 8/2010 | Tonar et al. | 428/141 |
| 2011/0134050 | A1 | 6/2011 | Harley | |
| 2012/0116709 | A1 * | 5/2012 | Martin et al. | 702/141 |
| 2012/0225250 | A1 * | 9/2012 | Kuznetsov et al. | 428/156 |
| 2012/0229882 | A1 * | 9/2012 | Fish et al. | 359/267 |
| 2013/0019618 | A1 * | 1/2013 | Veerasamy et al. | 62/85 |
| 2013/0048597 | A1 * | 2/2013 | Tanabe et al. | 216/13 |
| 2014/0021400 | A1 * | 1/2014 | Coenjarts | 252/79.4 |
| 2014/0176836 | A1 * | 6/2014 | Brecht et al. | 349/16 |
| 2014/0266931 | A1 * | 9/2014 | Shkembi | 343/712 |

OTHER PUBLICATIONS

Gustafsson et al., "Design of Frequency Selective Windows for Improved Indoor Outdoor Communications"; IEEE transactions on antennas and propagation; vol. 54, No. 6, Jun. 2006, pp. 1897-1900.*

* cited by examiner

METHOD AND APPARATUS FOR IMPROVING RADIO FREQUENCY SIGNAL TRANSMISSION THROUGH LOW-EMISSIVITY COATED GLASS

BACKGROUND

In the interests of conserving energy, windows with a low emissivity (low-E) coating have grown in popularity over the years. Such windows are now common in new commercial construction. These windows offer the benefits of conserving energy and money by reducing the need for air conditioning and/or heating. However, such windows have a severe impact on radio frequency (RF) signals. The coatings that are applied to window glass to transform it to a low-E window are comprised mainly of metals. Although the coatings are thin and transparent, their metallic content is effective at conducting electricity. This makes the coatings efficient reflectors of broad bands of radio frequency signals. Signals transmitted through the windows can be attenuated at levels of 30 decibels (dB) or more. Furthermore, commercial construction tends to use other materials that further block RF signals. Materials such as concrete, brick, mortar, steel, aluminum, roofing tar, gypsum wall board, and some types of wood all offer varying degrees of RF absorption. The result is that many newer commercial buildings severely impede RF signals from getting into or out of the buildings.

Nonetheless, RF devices have become an important part of modern life, especially with the emergence of smartphones, which have a variety of RF devices built-in. Such devices may include cellular transceivers, wireless local area network ("wi-fi") transceivers, Global Positioning System (GPS) receivers, Bluetooth transceivers and, in some cases, other RF receivers (e.g., FM/AM radio, UHF, etc.). As the popularity of such devices has grown, the importance of being able to use RF-based features within the confines of modern commercial buildings has grown.

Currently there are several commercially available techniques to facilitate the use of smartphones or similar devices within affected buildings. All of these techniques pose challenges, both for the installer as well as the user, depending on the technique. They include the following:

First, an external antenna can be connected to most cell phones in order to improve antenna gain. However, there still must be sufficient signal within the building and the cell phone must remain connected via a cable. This solution can be inconvenient and has performance limitations in some circumstances.

Second, a femtocell can be used. A femtocell is a device that resembles a wireless router and can be purchased from mobile service providers. This device connects to an existing broadband internet connection in a home or office, and radiates cell phone signals to a maximum range of about 40 feet. The maximum coverage per device is approximately 5000 square feet. Depending on the mobile provider, these devices can support between four and 16 simultaneous calls and require data bandwidths of greater than 1.5 Mb/s. Typically, prepaid phones are not supported with this solution. Also, these devices must be located near a window to provide a GPS signal. However, while a femtocell will support cellular signals, low-E coated windows still block GPS signals. This latter problem can be addressed by an external GPS antenna connected to the femtocell. Although connections initiated via the femtocell automatically connect to cell towers when the phone moves outdoors during a call, it does not work the other way—calls are dropped if the connection is established outdoors via a cell tower and the phone is then moved indoors where a femtocell is located. Another disadvantage of using femtocells in office buildings is that they are not universal for all mobile providers. A different femtocell must be purchased and set up for each provider.

The third solution is the deployment of a cellular repeater or booster that consists of an external antenna, a bi-directional amplifier, and internal antennas for re-transmission. These can be installed by individual carriers, whose equipment will only work for that carrier, or by independent installers who can provide multi-carrier and multi-band equipment. Second generation (2G) and third generation (3G) technologies all operate in the 850 MHz (cellular) and 1900 MHz (PCS) bands. All major carriers (e.g., Verizon, AT&T, Sprint and T-Mobile) operate in this dual-band region. Fourth generation (4G) systems operate at 700 MHz, 1700/2100 MHz and require different antennas than the 2G/3G dual bands. Most currently deployed repeaters were designed for 3G technology and do not operate at 4G frequencies. 5-band amplifiers, which operate over both 3G and 4G bands, have recently become available, but are likely not compatible with currently deployed antennas and will probably be incompatible with the next generation of cellular hardware. Cellular repeaters also do not boost Wi-Fi, WiMax and other signals in the 5 GHz band. In general, the use of repeaters will constantly require upgrades as technology advances.

There are additional limitations to the use of repeaters. Most applications require a custom installation. There must be room for antennas to be placed on the roof and cables must be run from them to interior locations. There is also a tradeoff between using antennas which provide a high gain but are unidirectional, and thus only boost signals from a single cell tower, and omni-directional antennas that provide less gain. The strongest amplifiers have enough gain to provide indoor coverage of up to about 100,000 square feet. This number is typically much lower, though, due to interior building materials that provide obstacles to the signal and unusual building geometries. In addition, concrete and steel floors significantly attenuate the signals, resulting in the need for separate amplifiers on every floor. Moreover, the cost of outfitting a commercial building can exceed $10K per floor.

BRIEF DESCRIPTION OF THE DRAWINGS/FIGURES

FIGS. 3*a*-3*d* illustrate possible patterns of ablation, according to an embodiment.

Figure 4:
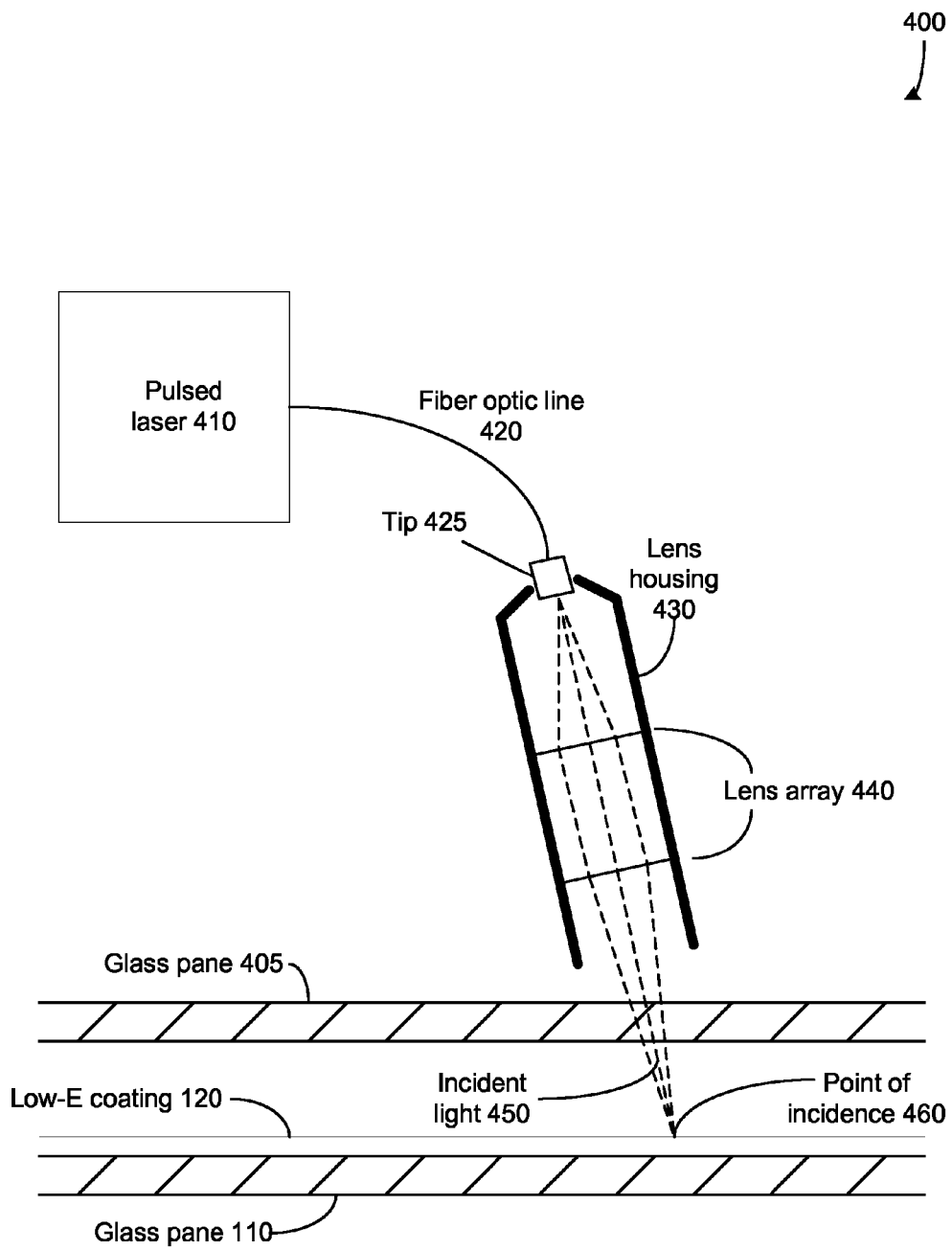

FIG. 4 illustrates a process and apparatus for ablation, according to an embodiment.

Figure 5:
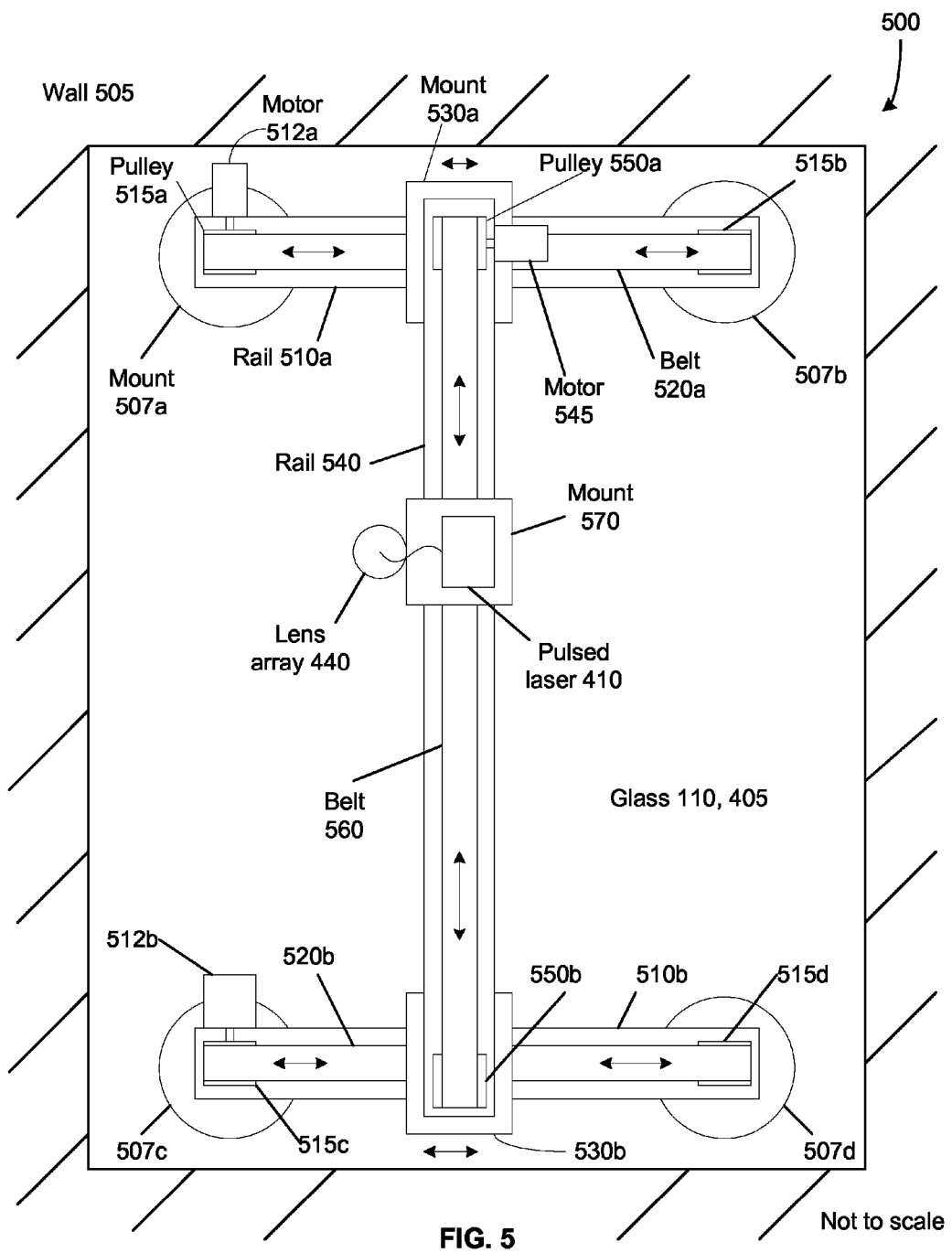

FIG. 5 illustrates an apparatus for ablation, according to an embodiment.

Figure 6:
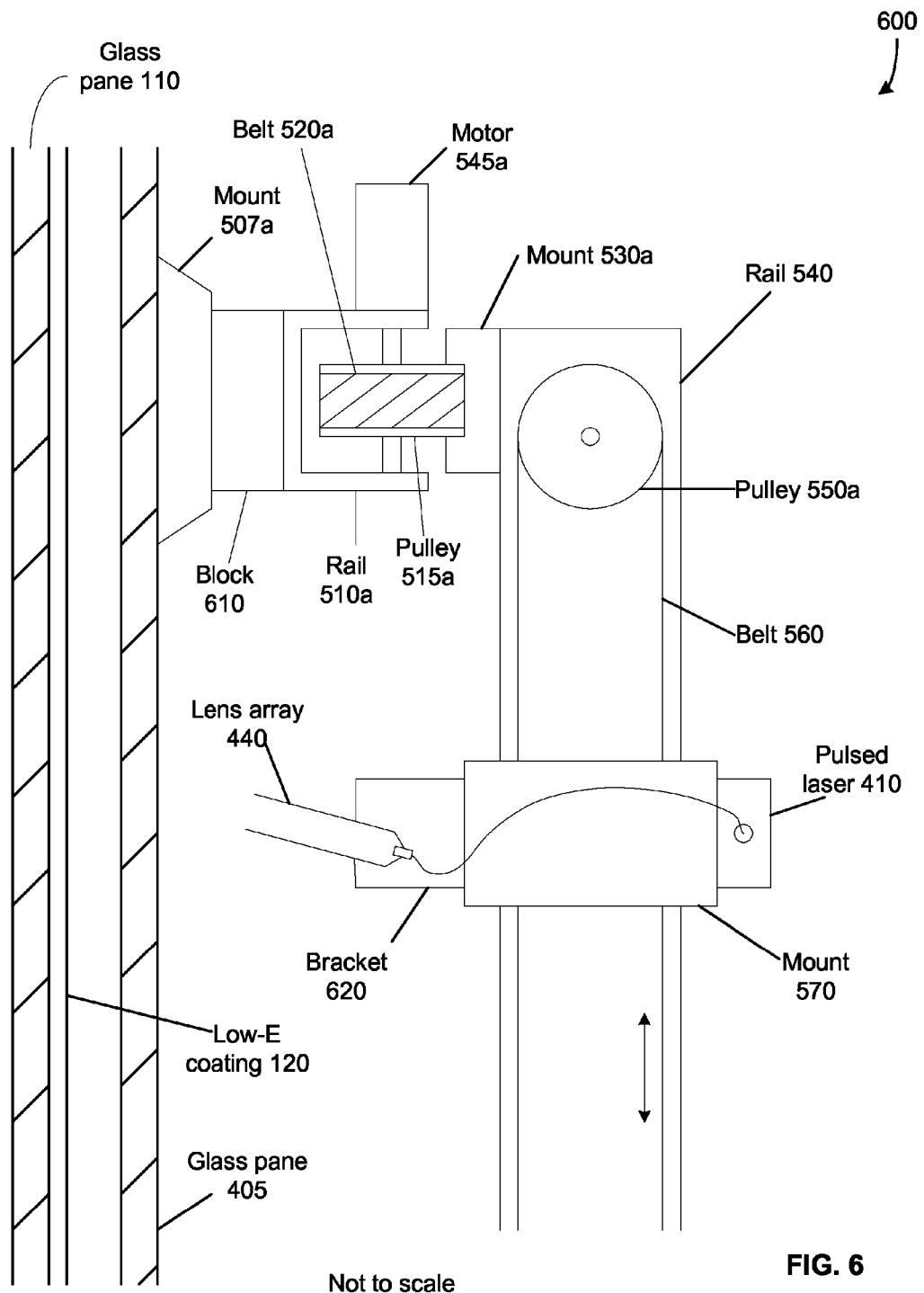

FIG. 6 illustrates the apparatus of FIG. 5 from a side view, according to an embodiment.

In the drawings, the leftmost digit(s) of a reference number identifies the drawing in which the reference number first appears.

DETAILED DESCRIPTION

An embodiment is now described with reference to the figures, where like reference numbers indicate identical or functionally similar elements. While specific configurations and arrangements are discussed, it should be understood that this is done for illustrative purposes only. A person skilled in the relevant art will recognize that other configurations and arrangements can be used without departing from the spirit and scope of the description. It will be apparent to a person skilled in the relevant art that this can also be employed in a variety of other systems and applications other than what is described herein.

The following describes a method and apparatus for modifying low-E coated glass, so that windows using the processed glass allow uninterrupted use of RF devices within commercial or residential buildings. The method and apparatus are applicable to treating glass panels at the factory before installation, as well as treating windows in-situ after installation. At the same time, glass processed in the manner described herein will not significantly diminish the energy conserving properties of the low-E coating.

This method and apparatus for improving RF transmission through low-E coated glass involves a permanent change to the low-E coating on the window. The coating is normally conductive over the entire area of the glass; this method and apparatus disrupts the conductivity of the coating in small regions. In an embodiment, the method involves ablating the low-E coating along narrow contiguous paths, such that electrical conductivity can no longer occur across the paths. The paths may take the form of intersecting curves and/or lines, so that the remaining coating consists of electrically isolated areas.

In an embodiment, this process is performed using a pulsed laser to remove (i.e., ablate) the low-E coating. In this method, the pulsed laser is focused onto the surface of the sheet of glass where the coating is located. With each pulse of the laser, a small (e.g. 20-25 micron diameter) circular spot is ablated from the glass, permanently removing it. In alternative embodiments, the ablated spot may be anywhere from 10-200 microns in diameter. By pulsing the laser many times per second (e.g. 100 kHz in an embodiment), while simultaneously moving the laser over the low-E coating, a path of overlapping ablated spots results, creating the appearance of a thin line (in much the same manner that a laser printer creates the appearance of a line on paper). The line can be straight or curved, and normally for a large window there will be many such lines that are ablated, with the spacing of the lines or curves depending on the desired characteristics of the RF reception through the glass.

Due to the nature of low-E coatings, their energy conserving properties are largely unaltered by such ablation if the total area of ablation is kept small. For example, if a window has a series of lines ablated into the coating, but the total area of the lines is kept small (e.g. <2% of the total glass area), then the impact to the energy conserving properties will be similarly small, and therefore acceptable for most applications.

The impact on RF signal transmission through the window, however, is not a simple function of ablated area. For example, a low-E coated window that has had only 1% of its area ablated with a regular grid pattern can experience a much greater throughput benefit than might be suggested by only having 1% of the area ablated. RF testing has confirmed that this is the case, showing that for some ablation patterns, a 1% area ablation of simple grid lines can change the insertion loss of such a window from over 35 dB (less that 1/10th of 1% throughput) prior to ablation to less than 10 dB (nearly 10% throughput) after ablation, which is a significant improvement. Alternatively, a low-E coated window that has had 1% of its area ablated will only have its infrared-reflecting properties reduced by 1%. Therefore a very small change to the infrared properties of the low-E coating can result in a very large benefit in the RF transmission properties.

Figure 1:
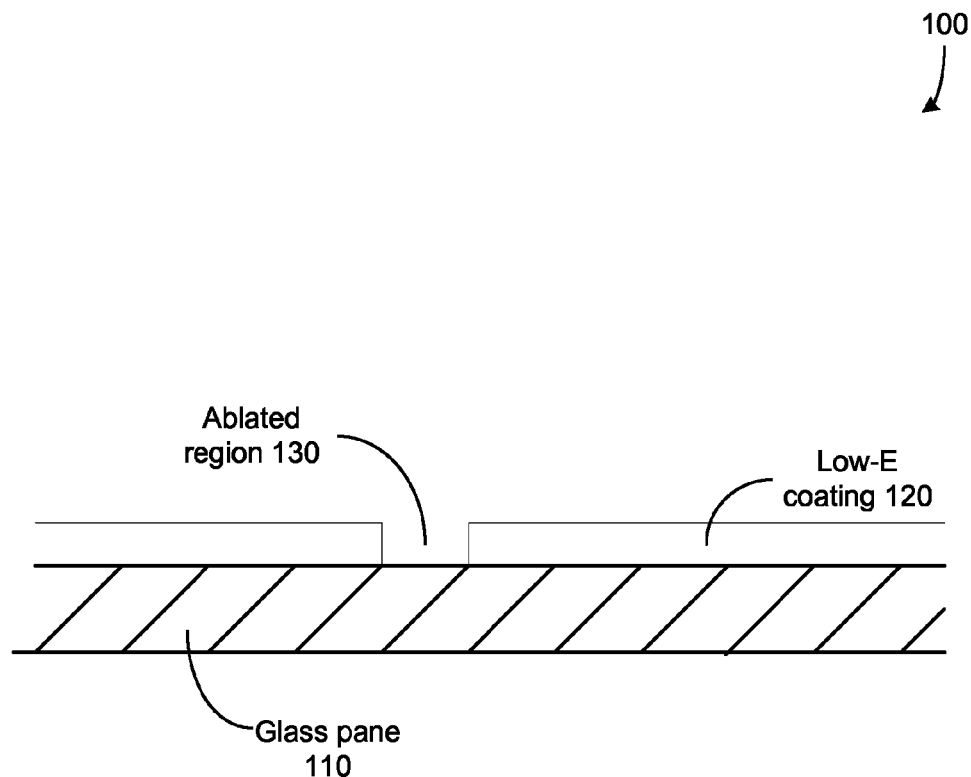
FIG. 1 is a diagram showing the results of ablation of a low-E coating, according to an embodiment.

FIG. 1 illustrates a side view of a coated glass pane that has undergone the process described herein, according to an embodiment. A glass pane 110 is shown with a low-E coating 120. An ablated region 130 is shown. Here, the low-E coating 120 has been removed by laser ablation.

Figure 2:
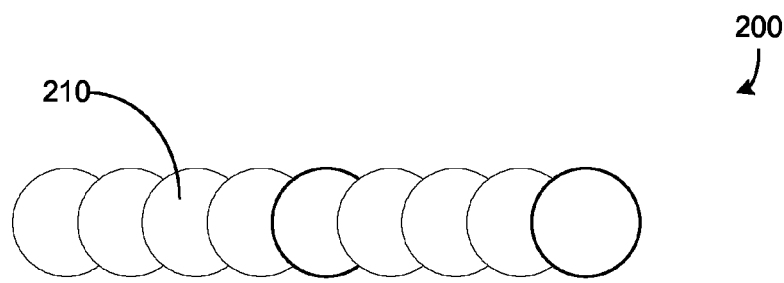
FIG. 2 illustrates a series of ablated spots, according to an embodiment.

In an embodiment, a pulsed laser may be used, where each pulse delivers enough energy to ablate a spot of the low-E coating 120. The laser is moved in a plane that is approximately parallel to the glass as it operates. The laser moves across the glass in a linear or curvilinear manner. The result is shown in FIG. 2, according to an embodiment. A sequence of ablated spots 210 is formed. This creates a path 200 in which the low-E coating 120 has been removed. As will be described in greater detail below, a series or pattern of intersecting ablated paths may be created in the coating, while leaving behind the coating in untouched areas. In an embodiment, only a very small percentage of the area of the low-E coating is removed from the glass, and most of the coated glass remains untouched. These paths are produced in such a way as to create areas of the low-E coating that are electrically isolated. This permits the glass to retain most of its energy conserving properties, while the ablated paths allow passage of RF signals through the glass. In various embodiments, a spot 210 may be 20-25 μm in diameter, so that each path will be approximately this width. In alternative embodiments, different sized spots (e.g., 10-200 microns in diameter) and paths may be used. Moreover, in the illustrated embodiment, the spots overlap. In an embodiment, the amount of overlap may be approximately 50% by area; the extent of overlap may vary in alternative embodiments. In some embodiments, the overlap may range from 25% to over 90% for example.

Figure 3A:
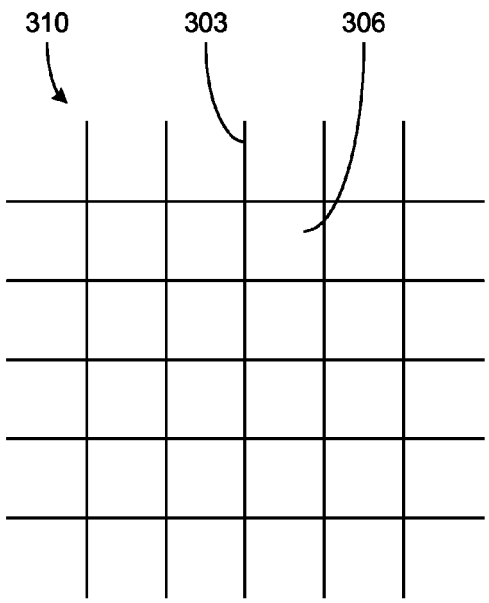
Figure 3B:
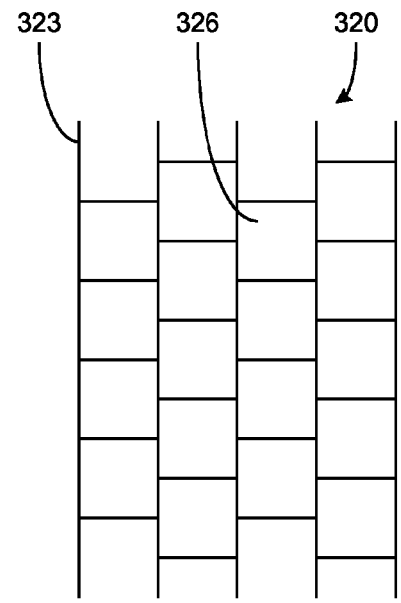

The pattern of ablated intersecting paths may be varied. Various grid-like patterns that may be used are illustrated in the embodiments of FIGS. 3A-3D. In FIG. 3A, a series of paths 303 are created as line segments in essentially vertical and horizontal orientations. This leaves behind areas of low-E coating (such as region 306) that are electrically isolated from each other. A different pattern is illustrated in FIG. 3B. Here, the horizontal path segments are disjointed. As in the previous case, regions of low-E coating are left behind, such as region 326.

Figure 3C:
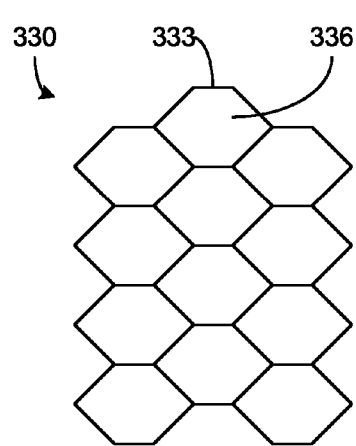
Figure 3D:
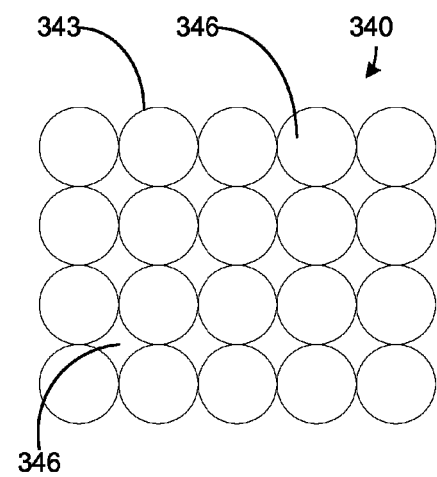

In alternative embodiments, the ablated intersecting paths are not necessarily limited to horizontal and vertical line segments. As shown in the embodiment of FIG. 3C, the ablated paths 333 may create a honeycomb pattern, creating regions of low-E coating 336. Another embodiment is illustrated in FIG. 3D, where the ablated paths 343 take the form of circles that touch each other. As in the previous examples, coated regions remain, such as regions 346 both inside and outside the circles. Alternative patterns, apart from those illustrated here, may also be employed. No particular pattern is necessarily superior to another, unless enhanced transmission of RF signals of a particular polarization is desired.

In embodiments, the ablated area of a window may be 2% or less of the total area. In other embodiments, a different percentage may be used (e.g. 5% or less total area of a low-E coating removed, and 95% total area of a glass sheet retaining the low-E coating). Note that while ablation of a higher percentage of the area may improve the transmission of RF signals through the window, ablation of more of the low-E coating diminishes the energy conserving properties of the window.

In embodiments, the grid spacing can be range from 2-10 mm. In general, smaller isolated areas of low-E coating facilitate improved RF transmission at shorter wavelengths, whereas larger overall size of the entire ablated pattern tends to facilitate longer wavelengths. Patterns that need to allow for transmission of multiple RF frequencies, while providing maximum transmission across all those frequencies, may have an overall ablation area dictated by the longer wavelengths while simultaneously having the grid/line spacing dictated by the shorter wavelengths.

The overall area of the pattern may vary in different embodiments. Larger patterns, by overall area, generally allow improved RF transmission. In some situations, however, the permissible area for a pattern may be limited. In such a case, transmission of RF signals may still be improved if the pattern area has a length and width in excess of approximately two times the wavelength of the RF signal.

An apparatus for the ablation of low-E coating is illustrated in FIG. 4, according to an embodiment. Glass pane 110 is shown, having low-E coating 120. A pulsed laser 410 creates the necessary light and transmits it through a fiber optic line 420. In the illustrated embodiment, laser pulses exit a fiber tip. The beam expands and passes through a set of lenses (lens array 440) in order to focus the light. In the illustrated embodiment, the lens array 440 is contained in a lens housing 430. Incident light 450 strikes the coating 120 at a point of incidence 460. In an embodiment, it may be desirable for the light to strike the coating 120 at a non-normal angle. This would avoid reflection of the light back into the lens array 440.

Note that in some situations, the coated glass pane 110 may be part of a double pane window. Such a configuration is common in modern construction. The second pane is shown in FIG. 4 as glass pane 405. The low-E coating 120 typically resides on the inside surface of one of the panes. In the illustrated embodiment, the light passes through glass pane 405 before striking the coating 120 on the other pane. In an alternative embodiment (not shown), the coating may be present on the pane closest to the laser, in which case ablation would be performed on the inside surface of the closer pane.

The wavelength of the laser used in various embodiments may differ. In some embodiments, the wavelength may be greater than 1400 nm. Such wavelengths have the advantage of providing improved eye safety to the operator and nearby persons compared to shorter wavelengths. In an alternative embodiment, the wavelength may be 1064 nm, which is a commonly used wavelength for marking lasers. Moreover, as noted above, in an embodiment the laser 410 is a pulsed laser. In an embodiment, the pulse width is less than 10 nanoseconds (ns), although pulse widths as great as 100 ns or longer may be used. Further, in an embodiment each pulse delivers at least 3 microjoules ($\mu J$) of energy. In alternative embodiments, values of these parameters may differ as will be understood by a person of ordinary skill in the art.

Ablation may be performed on a window during the manufacturing process or during or after the installation process. In an embodiment, ablation may be performed on a window that is already in place in an existing wall. An apparatus 500 for performing this process in such a context is illustrated in FIG. 5, according to an embodiment. Here, a double pane glass window is shown after having been installed in a wall 505. In this example, there are two panes of glass in the window, 110 and 405. In the illustrated embodiment, the apparatus includes four mounts 507a-507d for attachment to the window. In an embodiment, mounts 507a-507d may be suction cups. Other embodiments may use other means for attachment to the window or to the surrounding wall 505, as would be understood by a person of ordinary skill in the art.

In the illustrated embodiment, the pulsed laser 410 is attached to a rail 540 in a manner that allows the laser to slide or otherwise move along the length of this rail. In particular, the pulsed laser 410 and lens array 440 may be attached to a mount 570 that is attached to a belt 560 incorporated into this rail lengthwise. The belt 560 may be mounted on two pulleys, 550a and 550b at either end of rail 540. The belt 560 is therefore movable; movement of the belt serves to move the pulsed laser 410 and lens array 440 mounted thereon. One of the pulleys may be driven by a motor 545. In the illustrated embodiment, motor 545 turns pulley 550a, thereby driving the belt 560. This in turn moves the pulsed laser 410 and its lens array 440 along the length of rail 540 (up and down in the illustrated embodiment). The motor 545 maybe capable of turning in either direction, so that the belt 560 may move in either direction, as shown. In this way, the laser 410 may be moved in either direction along rail 540. In an alternative embodiment, the motor 545 may be mounted at the opposite end of rail 540 to drive pulley 550b. In yet another embodiment, two motors may be used, one at each of pulleys 550a and 550b, and operating in synchronicity.

In the embodiment of FIG. 5, the rail 540 may in turn be mounted on two other rails, 510a and 510b. These latter two rails are essentially parallel to each other. One end of rail 540 may be mounted on rail 510a by means of a mount 530a; similarly, the opposite end of rail 540 may be mounted on rail 510b by means of a mount 530b. The ends of rail 540 may be mounted on rails 510a and 510b such that rail 540 may slide or otherwise move along the lengths of rails 510a and 510b (side to side in the illustrated embodiment).

Here, rail 510a includes a belt 520a that is mounted on two pulleys 515a and 515b at either end of rail 510a. The mount 530a is attached to this belt. Similarly, rail 510b includes a belt 520b that is mounted on two pulleys 515c and 515d at either end of rail 510b. The mount 530b is attached to this belt. Pulley 515c is driven by a motor 512b. This serves to move belt 520b. Likewise, pulley 515a is driven by a motor 512a, which serves to move belt 520a. By synchronizing the actions of motors 512a and 512b, belts 520a and 520b may be simultaneously moved in the same direction at the same speed. Given that rail 540 is mounted on the belts 520a and 520b, this serves to move rail 540. The motors 512a and 512b can turn in either direction; this allows respective belts 520a and 520b to move in either direction, as shown. As a result, rail 540 (and pulsed laser 410 and lens array 440, which are attached to this rail) can be moved from side to side in the illustrated embodiment.

In alternative embodiments, motors 512a and 512b may instead be attached to pulleys 515b and 515d. Moreover, in other embodiments, any or all of the pulleys 515a-515d may be driven by motors that are synchronized to one another.

The combined motions of belts 520a, 520b, and 560 allow the pulsed laser 410 and lens array 440 to move about in a two-dimensional plane that is essentially parallel to the window. By controlling the speed and direction of motors 512a, 512b, and 545, the laser 410 and lens array 440 can be made to move over the window in any desired path. By energizing the pulsed laser 410 while in motion, a path can be ablated in the low-E coating of this window.

In in an embodiment, the motors 512a, 512b, and 545 may be controlled by a programmable computer (not shown). By programming this computer appropriately, the computer can be made to create and deliver control signals to these motors to control the motion of the pulsed laser 410 and lens array 440, and thereby control the path and pattern of ablation. For example, the apparatus 500 may be used to create any of the patterns illustrated in FIGS. 3A-3D. Alternatively, the motors may be controlled by hardwired logic instead of a computer executing software. Alternatively, the motors may be controlled by hand.

As noted above, other patterns may be created, different from or in addition to these. In an embodiment, the pulsed laser 410 and lens array 440 can be made to move at an overall speed of 1 m/s; other speeds are possible.

In an embodiment, the motors illustrated in FIG. 5 are electrical. They may be stepper motors or non-stepper (e.g., servo) motors. In alternative embodiments, belts such as those shown may not be used; instead, a linear actuator may be used to move the pulsed laser 410 along rail 540. Likewise, linear actuators may be used to move the rail 540 from side to side along rails 510a and 510b. Such actuators may be pneumatic, hydraulic, or electromagnetic, for example.

Also, while FIG. 5 shows the pulsed laser 410 moving along vertical rail 540, which in turn is moved along the horizontal rails 510a and 510b, other orientations are possible. For example, rails 510a and 510b may be attached to the window vertically, and rail 540 may be oriented horizontally. Also, rail 540 is shown in this figure to be approximately perpendicular to rails 510a and 510b. In other embodiments, this is not necessarily the case; rail 540 may reside at some other angle relative to rails 510a and 510b. In addition, FIG. 5 shows apparatus 500 positioned vertically on a mounted window. Alternatively, the apparatus 500 may be positioned horizontally to operate on an unmounted window that is lying flat, prior to the window's installation, or to operate on a coated sheet of glass prior to the glass being incorporated into a double pane window.

FIG. 6 illustrates a side view of the apparatus of FIG. 5. A low-E coating 120 is shown on glass pane 110, which is incorporated along with glass pane 405 in a double pane window. Pulsed laser 410 is shown attached to mount 570. Lens array 440 is also attached to mount 570, via a bracket 620. Mount 570 is attached to belt 560 which is in turn mounted on pulley 550a and pulley 550b (which is not visible here). As stated above, the motion of belt 560 allows for the vertical movement of pulsed laser 410 and lens array 440 in the illustrated embodiment.

One end of rail 540 is mounted on belt 520a, which is in turn mounted on a pulley 515a and a pulley 515b (not shown). These pulleys, along with belt 520a, are incorporated in rail 510a. The near end of this rail is attached to the window by a mount 507a and support block 610. A similar mounting configuration may be in place at the far end of rail 510a. Pulley 515a is turned by motor 545a, thereby moving belt 520a and rail 540. A similar configuration is present at the opposite end of rail 540. As stated above, this allows for horizontal movement of pulsed laser 410 and lens array 440.

In embodiments, the laser 410 may be supported by a spring mechanism (not shown). For example, a constant force spring may be used along the y-axis to support the laser 410 and reduce mechanical stress in the illustrated system.

Note that all the rails are approximately parallel to the glass. This allows the laser to operate in a plane that is approximately parallel to the glass, maintaining the focused laser spot on the low-E coating across the entire ablation pattern area. In embodiments, the rails are within 500 microradians of parallel.

While the embodiments described above address ablation using a mechanically scanned laser, in alternative embodiments other methods may be used to remove or create the absence of a low-E coating to achieve the results exemplified in FIGS. 3A-3D and FIG. 1. An optically scanned laser may be used to produce the specified electrically isolated areas in the low-E coating. In such an embodiment, the laser beam may be directed at the necessary locations on the low-E coating by a system of one or more mirrors. Alternatively, mechanical abrasion methods may be used to remove the coating; a photolithographic method and acid etching may also be used. Alternatively, an electric discharge machine may also be used. In alternative embodiments, all of these techniques (including laser ablation) may be employed alone or in any combination to remove portions of a low-E coating from a sheet of glass.

Another embodiment for achieving the results exemplified in FIGS. 3A-3D and FIG. 1 could involve the use of ink jet printing techniques for depositing the low-E coating onto the glass surface in such a way as to intentionally leave areas without any coating to form the described patterns. Alternatively, a shadow mask could be used to intentionally not coat portions of the glass and form the described patterns.

An alternative process for achieving some transmission of RF signals through a low-E coated window is to purposely fabricate the glass with large areas free of low-E coating. An example that would provide some benefit is to leave a border around the entire edge of the window that is not coated.

As noted above, the processing of a sheet of glass according to some of these methods may be performed on an installed window. Any of the techniques may be performed at a factory prior to installation. In this latter case, the processing may be completed on a single glass sheet at a time, or an assembly line style operation may be used. Here, multiple stations may be involved. Each station would perform ablation (or removal by other means) of the low-E coating along one or more paths, then would send the glass sheet to another station, where removal of the coating along one or more other paths may be performed, and so on. As would be understood by a person of ordinary skill in the art, such an arrangement would improve throughput at a processing or manufacturing facility.

Methods and systems are disclosed herein with the aid of functional building blocks illustrating the functions, features, and relationships thereof. At least some of the boundaries of these functional building blocks have been arbitrarily defined herein for the convenience of the description. Alternate boundaries may be defined so long as the specified functions and relationships thereof are appropriately performed.

While various embodiments are disclosed herein, it should be understood that they have been presented by way of example only, and not limitation. It will be apparent to persons skilled in the relevant art that various changes in form and detail may be made therein without departing from the spirit and scope of the methods and systems disclosed herein. Thus, the breadth and scope of the claims should not be limited by any of the exemplary embodiments disclosed herein.

What is claimed is:

1. A method of removing or creating an absence of a portion of a low emissivity (low-E) coating from a sheet of glass, comprising:

removing or creating an absence of a portion of the low-E coating in a pattern of intersecting lines or curves, in a manner that keeps the majority of the glass coated by the low-E coating, where all the lines or curves are interconnected and leave behind a plurality of areas of the coating that are permanently electrically isolated by the removal or absence of the portion of the coating and that remain electrically isolated while the glass is in use, wherein the removed portion or absence of the coating is of a size and shape such that the coated sheet of glass allows transmission, through the glass, of cellular and wireless local area network (Wi-Fi) radio signals with an insertion loss of 10 dB or less.

2. The method of claim 1, wherein the total area of the remaining low-E coating comprises 95% or more of the total area of the sheet of glass, and the area of the sheet of glass where the low-E coating has been removed comprises 5% or less of the total area of the sheet of glass.

3. The method of claim 1, wherein the portion of the low-E coating that is removed or absent in the pattern, has a plurality of the intersecting lines or curves, the lines or curves having a width of 10 to 200 microns.

4. The method of claim 3, wherein the portion of low-E coating is removed by one or more of
mechanical abrasion,
an acid etching process, or
an electric discharge machine.

5. The method of claim 3 wherein the portion of low-E coating is removed by ablation using a laser beam that moves along a path corresponding to the intersecting lines or curves.

6. The method of claim 5, wherein the laser is a pulsed laser.

7. The method of claim 6, wherein each pulse delivers at least 3 microjoules of energy and a width of each pulse of the laser is less than or equal to 100 nanoseconds.

8. The method of claim 6, wherein the pulsed laser ablates a series of overlapping spots to create the intersecting lines or curves, and wherein each of the spots overlaps a preceding spot by 25% to over 90% by area.

9. The method of claim 5, wherein the wavelength of the laser is greater than 1400 nm.

10. The method of claim 5, wherein the wavelength of the laser is approximately 1064 nm.

11. The method of claim 5, wherein the laser moves at a speed of approximately 1 meter per second during ablation.

12. The method of claim 5, wherein the laser is moved using a motorized mechanism comprising one or more motors to move the laser in a first direction and one or more motors to move the laser in a second direction orthogonal to the first direction, wherein the movement of the laser takes place parallel to the sheet of glass.

* * * * *